Jan. 3, 1967 W. J. SCHNEIDER, JR 3,296,546
TRANSISTOR CIRCUIT CONSTRUCTIONS FOR ACTIVE TYPE BAND PASS FILTERS
Filed Aug. 31, 1964 3 Sheets-Sheet 1

WILLIAM J. SCHNEIDER, JR.
INVENTOR.

BY V. C. MULLER
ATTORNEY.

WILLIAM J. SCHNEIDER, JR.
*INVENTOR.*

*BY* V. C. MULLER
ATTORNEY.

WILLIAM J. SCHNEIDER, JR.
*INVENTOR.*

*BY* V. C. MULLER
ATTORNEY.

United States Patent Office 3,296,546

Patented Jan. 3, 1967

3,296,546

TRANSISTOR CIRCUIT CONSTRUCTIONS FOR ACTIVE TYPE BAND PASS FILTERS

William J. Schneider, Jr., Burbank, Calif., assignor to the United States of America as represented by the Secretary of the Navy Filed Aug. 31, 1964, Ser. No. 393,457
5 Claims. (Cl. 330—21)

The invention described herein may be manufactured and used by or for the Government of the United States of America for governmental purposes without the payment of any royalties thereon or therefor.

This invention relates to an improved frequency selective circuit of the type which provides a voltage transfer function which approximates the pass characteristics of naturally resonant frequency selective circuits, but which instead of employing inductors in its construction, is made of resistors, capacitors, and amplifying devices. Such circuits are commonly called "active filter circuits."

For purposes of this specification, a "voltage transfer function" is hereby defined as an analytical expression or plot representing the values of the ratio of output voltage to input voltage of a circuit, as a function of frequency. This transfer function is often expressed in terms of the complex variable $\sigma+j\omega$, commonly referred to as the Laplace transform operator, this form of expression being highly convenient for purposes of linear systems analysis.

Active filter circuits of the type referred to, are used in a variety of electronic fields where the signal frequencies are below radio frequencies (R.F.). The fact that they do not contain inductors makes them particularly useful where picking up of stray signals is to be avoided. The amplifying devices employed in their construction are necessary to compensate for the losses in the coupling of the signals through the resistance and capacitance network forming their constructions. The term "active filters" is derived from the fact that they contain such amplifying devices. The characteristics of an active filter are specified in terms of the "pass band center frequency" which corresponds to the peak of the circuit's frequency-amplitude characteristic curve, and the "damping factor." The latter is a co-efficient which is analytically related to the degree of steepness of gradient at which attenuation occurs above and below the pass band center frequency. When the magnitude of the damping factor is small the circuit is said to have a high degree of selectivity and its characteristic curve is quite steep. Conversely, a large magnitude of the damping factor corresponds to a low degree of selectivity and a flat characteristic curve. Active filters are typically employed as the individual stages of multi-stage band pass networks, which are formed by cascading individual frequency selective circuits, with each circuit individually characterized by different combinations of pass band center frequency and magnitude of damping factor.

The active filter circuits built in the past have been chiefly of three types, namely, a type employing two essentially independent positive feedback stages, a type employing a single feedback stage having a complex resistance and capacitance phase shifting network in the feedback path, and a type comprising a complex organization of high gain operational amplifiers including a major feedback path formed by an operational amplifier. For any one of these types of circuits it is difficult to synthesize a specific design for different desired combinations of pass band center frequency and magnitude of damping factor. In the case of the type consisting of two independent feedback stages the center frequency of the circuit is determined by the selection of two non-conjugate sets of circuit design parameters associated with one and the other of the stages, and the damping factor is determined by a third set of parameters. Since the circuit design parameters determining center frequency are non-conjugate, there is no simple relationship by which values of the circuit component needed to provide a desired center frequency may be pre-calculated. As a result, where a variety of specific designs are needed to meet different specifications, the synthesis of each design requires complex calculations and/or emperically determined data. Both the resistance and capacitance phase shift, and the operational amplifier types of active filters are very complex circuits, and synthesis of each specific design requires critical and often time emperical selection of a very large number of components. Moreover, as to the latter two types of circuits, the circuit design parameters which determine frequency and the circuit design parameters which determine magnitude of damping factor are interdependent, and the synthesis of specific designs for different desired combinations of frequency and damping factor require a series of trial and error adjustments for each design. Thus a simplification of the design characteristics of active filter circuits, by reduction in the number and simplification in kind of circuit component values which must be calculated and chosen to synthesize specific designs, is a desired objective.

This problem is further aggravated where a highly selective circuit, that is a circuit characterized by a low magnitude of damping factor, is desired because of the well known tendency of highly selective circuits to be unstable. This tendency toward instability is particularly a problem with the second and third previously mentioned types of prior art circuits.

The problem is also further aggravated in the construction of a circuit for passing narrow bands of signals in the ultra-low frequency range extended down to one cycle per second, and where the circuit is to be used with weak signals such as those in a range of signal levels extending down to 100 microvolts. Because of the extremely low efficiencies at which such low frequency signals are coupled through resistance and capacitance network, great care is needed to prevent undue deterioration of the weak signals.

Also, for many usages, it is desirable to have a frequency selective circuit which is adjustable with provision for independently selectively varying the pass band center frequency and the magnitude of damping factor. Circuits with provision for such adjustments are commercially available and are of the type formed by two independent feedback stages. However, as previously noted, in this type of circuit the center frequency is determined by two non-conjugate design parameters, and therefore the adjustable circuit requires reference to a complex "look up" table, and the change of two different dial settings in order to change center frequency of the circuit. Adjustment of the damping factor is provided by a third dial setting. Accordingly simplification in number and kind of adjustments which must be made in adjustable frequency selective circuits is a desired objective.

Along with the desire to find solutions to the above mentioned problems, there is the ever present desire that an active filter circuit be combinable with a gain amplifier stage at a minimum of cost and complexity.

Accordingly the objectives of the present invention include provision of:

(1) An improved active filter circuit having design characteristics such that the pass band center frequency and the damping coefficient may be independently predetermined by a choice of a small number of components which are simple to precalculate.

(2) An improved active filter circuit in accordance with the preceding objective having stable operating characteristics for low magnitudes of damping factor.

(3) An improved active filter circuit having special utility in the ultra-low frequency range of frequencies and where the circuit is to be used with very low levels of signals.

(4) An improved adjustable active filter circuit in which the pass band center frequency may be changed by the change of a single dial setting.

(5) The provision of an improved active filter circuit which is combinable with a gain amplifier stage at a minimum of cost and complexity.

Other objects and many of the attendant advantages of this invention will be readily appreciated as the same becomes better understood by reference to the following detailed description when considered in connection with the accompanying drawings wherein.

Figure 1:
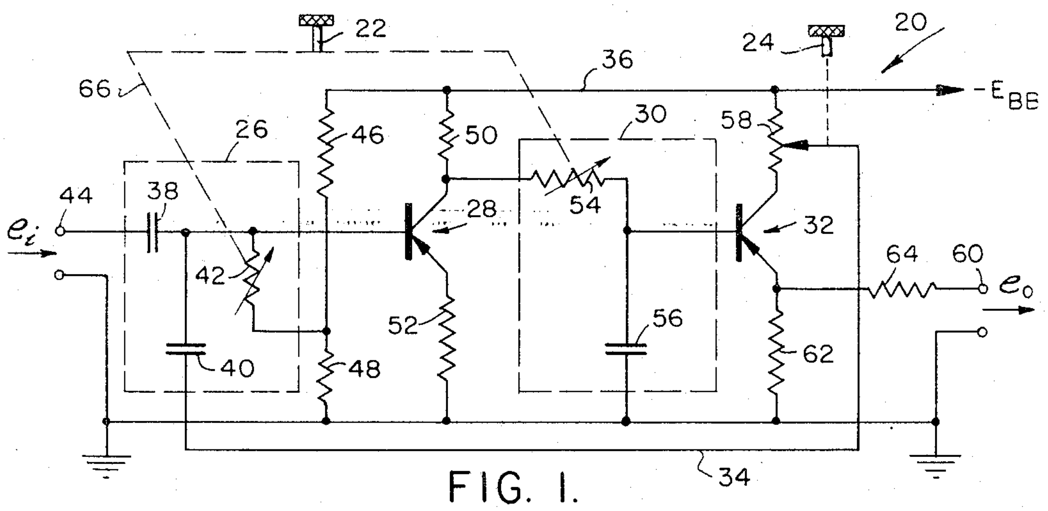
FIG. 1 is a schematic diagram of a circuit embodying the present invention.

Referring now to the drawing, and in particular to FIG. 1, a circuit 20 is an adjustable frequency selective circuit which provides a transfer function that approximates the pass characteristics of a selective circuit having natural resonance characteristics. Circuit 20 is provided with a frequency adjustment knob 22, by which the circuit may be selectively set to provide any desired pass band frequency in a predetermined range, and is also provided with a damping factor adjustment knob 24, by which the circuit may be selectively set to provide any magnitude of damping factor in a predetermined range. Circuit 20 generally comprises a passive summing and high pass network 26, a buffer transistor stage 28, a low pass network 30, an output transistor stage 32, and a feedback line 34 forming a feedback path from the output transistor to network 26. Buffer transistor stage 28 serves to isolate network 26 and 28 to avoid mutual interaction. The operating potential for the transistors is provided from a supply line 36 which is connected to a suitable source of voltage $-E_{BB}$. Summing and high pass network 26 comprises a pair of equal capacitors 38 and 40 and a variable resistor 42. One end of each of these capacitors and one end of the resistor are commonly connected to the base of transistor 28. A voltage input signal $e_1$, which consititutes the input of circuit 20, is applied to an input terminal 44, which in turn is connected to the other end of capacitor 38. Feedback line 34 is connected to the other end of capacitor 40. The values of capacitors 38 and 40 are chosen to be of sufficiently low values to present impedances which are substantially larger than the impedance of variable resistor 42. Thus capacitors 38 and 40 form equal and high impedance signal input branches which are connected to a common point, and thence through a single signal path to the return sides of the signal sources, the common point being the base of transistor 28 and the single signal path being variable resistor 42 and its associated ground return. This characteristic of network 26 effects a summing of the input signal $e_1$ from terminal 44 and the feedback signal from feedback line 34 at the base of transistor 28. Network 26 may also be considered as a network in which the effective combined capacity of capacitors 38 and 40 as parallel capacitors forms a capacitative impedance element serially connected in a signal path, and variable resistor 42 forms a resistance element shunt connected across the signal path at the signal output side of the capacitative element, providing the well known series-capacitance and shunt-resistance high pass network. A voltage dividing network consisting of serially connected resistors 46 and 48 is connected between supply line 36 and ground, and the junction between these resistors is connected to the other end of variable resistor 42, so that resistors 46 and 48 and variable resistor 42 form a bias network which places a fixed bias potential on the base element of transistor 28. A resistor 50 is connected between the collector of transistor 28 and supply line 36, and a resistor 52 is connected between the emitter and ground. Low pass network 30 comprises a variable resistor 54 connected between the collector of transistor 28 and the base of transistor 32, and a capacitor 56 connected between the base of transistor 32 and ground. At the collector of transistor 32, the resistance element of potentiometer 58 is connected between the collector and the supply line 36. A portion of the signal appearing across the resistance winding of potentiometer 58 is coupled to the feedback line 34 through the potentiometer's movable element. The signal appearing at the emitter of transistor 32 is coupled to an output terminal 60 as the voltage output signal $e_o$ of circuit 20. The value of the resistance member of potentiometer 58 and the value of a resistor 62 between the emitter and ground are made substantially equal, so that transistor 32 acts as a unity gain common emitter amplifier as to the signal coupled to feedback line 34. Transistor 32 acts as a common collector or "emitter follower" arrangement as to the signal coupled to output terminal 60. Circuit 20 also includes a resistor 64 between the emitter of transistor 32 and output terminal 60. Variable resistors 42 and 54 in networks 26 and 30 are made to provide the same range of resistance values and their constructions are such that they present equal values of resistance under equal displacements of their respective movable members. The movable members of each are connected to frequency adjustment knob 22 through a system of linkages, shown by dashed lines 66, that moves them simultaneously and with equal displacements under any change of the knob setting. Thus both variable resistors are varied simultaneously and equally by adjustment of knob 22. The damping factor adjustment knob 24 is operatively connected to the movable contact of potentiometer 58.

Figure 2:
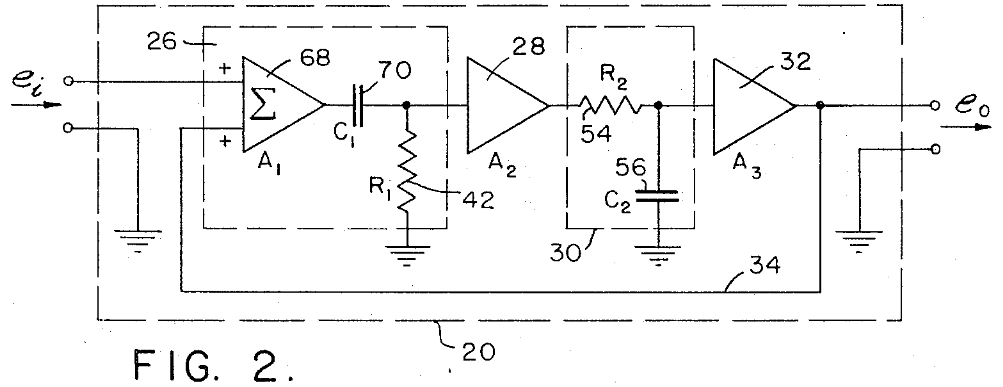
FIG. 2 is a functional block diagram of the circuit of FIG. 1.

FIG. 2 shows an equivalent block diagram of the detail circuit of FIG. 1. Passive summing and high pass network 26 is represented as an equivalent summing amplifier 68 of a gain $A_1$ followed by a resistance and capacitance high pass network in which the effective combined capacitance of capacitors 38 and 40 as parallel capacitors is represented as an equivalent single capacitor 70 having a value $C_1$, and variable resistor 42 is represented having a value $R_1$. The magnitude of gain $A_1$ is, of course, less than unity since the passive network has inherent losses. The transistor stage formed by transistor 28 is represented by amplifier having a gain $A_2$; variable resistor 54 and capacitor 56 of network 30 are represented as having values $R_2$ and $C_2$. The transistor stage formed by transistor 32 is represented as an amplifier having a gain $A_3$. Inversion of signal does not take place across equivalent summing amplifier, but such inversion does occur across common emitter stage 28, and between the base and collector of transistor 32. Therefore the feedback through feedback line 34 is in positive relationship as to input signal $e_1$. Accordingly, the amplifiers are simply represented by constant multipliers equal to their respective gains in the transfer function equations to follow. By well known techniques of linear feedback systems analysis employing the standard equation for a closed loop system it can be shown that the voltage transfer function of circuit 20 is:

$$\frac{e_0}{e_i}=\frac{S\tau}{S^2\tau^2+2S\tau\xi+1}\cdot A_1\cdot A_2\cdot A_3 \quad \text{(IA)}$$

where:

$$\tau=R_1C_1=R_2C_2 \quad \text{(IB)}$$

and where the coefficient $\xi$ is defined:

$$\xi=1-\frac{A_1\cdot A_2\cdot A_3}{2} \quad \text{(IC)}$$

The variable $\tau$ has the dimensions $$\left(\frac{\text{volts}}{\text{amp}}\right)\left(\frac{\text{amp second}}{\text{volt}}\right)=\text{seconds}$$

S is the complex variable $\sigma+j\omega$ commonly known as the Laplace transform operator, and having the dimension second$^{-1}$; and $\xi$ is a dimensionless coefficient. From Equation IA it is seen the voltage transfer function for circuit 20 is the real fraction in the right hand side of the equation multiplied by a constant multiplier. Those skilled in the fields of electrical engineering to which the invention most closely relates will recognize this real fraction as the form of Laplace transform for a circuit behaving in a manner following the classic natural laws of resonance. Therefore circuit 20 closely approximates the desired transfer function. In accordance with conventions associated with use of this specific real fraction as a transfer function, the value of the coefficient $\xi$ corresponds to the magnitude of the previously defined damping factor, and $\xi$ is the Greek letter analytical symbol for the damping factor. Examination of Equation IC reveals that when the expression $A_1\cdot A_2\cdot A_3$ has values between zero (0) and two (2), $\xi$ has a positive value between zero (0) and unity (1), which means that the system is not in oscillation. When the expression $A_1\cdot A_2\cdot A_3$ has a value of two (2) or more, $\xi$ is zero (0) or a negative number, which means that the system is in oscillation. The significance of Equation IB and IC is that circuit 20 provides the desired transfer function only if both the condition that $R_1C_1=R_2C_2$, and the condition that the value of $A_1\cdot A_2\cdot A_3$ is between zero (0) and two (2), are satisfied. The condition, $R_1C_1=R_2C_2$, is satisfied in circuit 20 by making the value of capacitor 56 in low pass network 30 equal to the effective combined capacitance of capacitors 38 and 40 as parallel capacitors, the latter capacitors 38 and 40 being in high pass network 26. Since the magnitudes of variable resistors 42 and 54 in the high and low pass network 26 and 30 are always equal under adjustment by knob 22, this condition is satisfied over the full range of adjustment of pass center frequency of the circuit. The condition that value for $A_1\cdot A_2\cdot A_3$ be between zero (0) and (2), is satisfied in circuit 20 by making the gain of the transistor stage 28 sufficient to permit the movable contact of potentiometer 58 to pick off the feedback signal at loop gain between zero (0) and two (2) within its range of movement across the resistance member. It is to be noted that certain effects, such as the effect of other components in the circuit upon the characteristic of the high and low pass network have been omitted in this discussion, and therefore the values of the components may in practice vary somewhat from the described relationships. It is also to be noted that in treating the amplifiers of the block diagram as constant multipliers in the derivation of Equation IA, it is being assumed that the transfer characteristics of each amplifier have negligible imaginary components, which is essentially true with transistors at frequencies below R.F., and that each amplifier stage has a highly stable fixed gain so that it essentially acts as an ideal voltage source. The latter assumption will be discussed at a later point in this specification.

Figure 3:
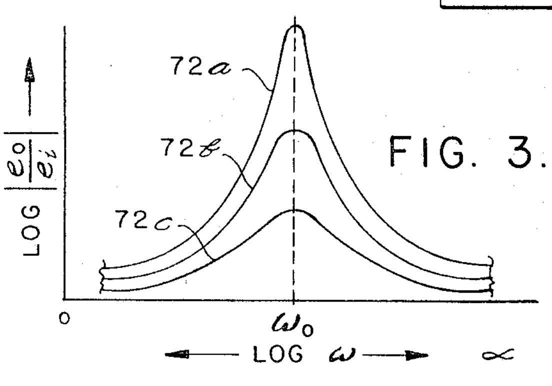
FIG. 3 is a graph illustrating the input-output characteristics of the circuit of FIG. 1.

By similar conventional analytic practices it can be shown that for steady state sinusoidal signals, the pass band center frequency is defined by the equation:

$$\tau=\frac{1}{\omega_0}=\frac{1}{2\pi f_0}=R_1C_1=R_2C_2 \quad \text{(II)}$$

and that the solution of Equation IA for $e_o/e_i$ as a function of frequency is:

$$\left|\frac{e_0}{e_i}\right|=k\frac{1}{2\sqrt{\left(\frac{\omega}{\omega_o}-\frac{\omega_o}{\omega}\right)^2+\xi}} \quad \text{(III)}$$

where $\omega_o$ is the angular frequency of the center of the pass band in radians per second, and $f_o$ is such frequency in cycles per second. Curves representing Equation III for various values of $\xi$ are shown in FIG. 3. Curve **72*a* is a plot for a value of 0.05; curve 72*b* for a value of 0.1; and curve 72*c*** for a value slightly greater than 0.5.

Figure 4:
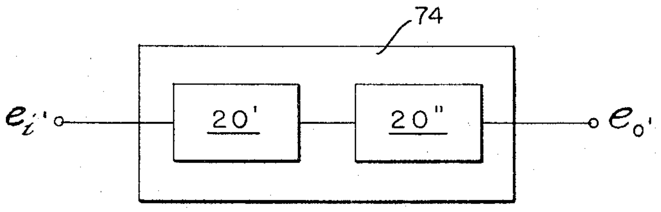
FIG. 4 is a block diagram of a filter network employing the circuit of FIG. 1.
Figure 5:
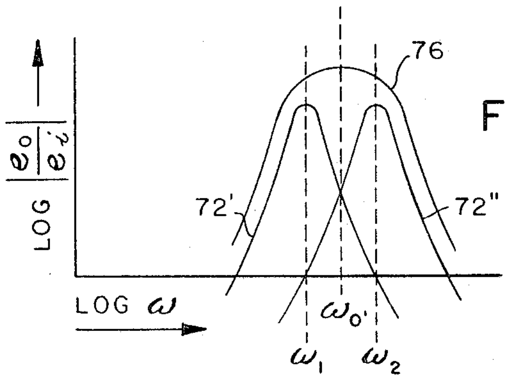
FIG. 5 is a graph illustrating the input-output characteristics of the network of FIG. 4.

FIGS. 4 and 5 illustrate a specific use of adjustable frequency selective circuit 20, in which a pair of such circuits 20′ and 20″ are cascade connected to form a filter network 74 for providing optimally flat band pass. The input to network 74 is a voltage input signal $e_i'$ and the output is a voltage output signal $e_o'$. Network 74 provides a desired band pass of predetermined frequency width centered about a frequency $\omega_o'$, FIG. 5. In accordance with well known standard equations for synthesizing an optimally flat band pass from a pair of frequency selective circuits which provide a classic resonance type pass characteristic, the frequency knobs of circuits 20′ and 20″ are adjusted to selectively center the transfer curve 72′ of circuit 20′ about a predetermined frequency $\omega_1$ below $\omega_o'$, and to selectively center transfer curve 72″ of circuit 20″ about a predetermined frequency $\omega_2$ above $\omega_o'$. The damping factor knobs are adjusted to selectively set equal degrees of steepness of curves 72′ and 72″ such that upper slope of curve 72′ intersects the lower slope of curve 72″ at a predetermined ordinal value on the graph. The transfer curve 76 for network 74, which is simply a plot of the products of the plot values of curves 72′ and 72″, is the transfer curve of the desired band pass.

Figure 6:
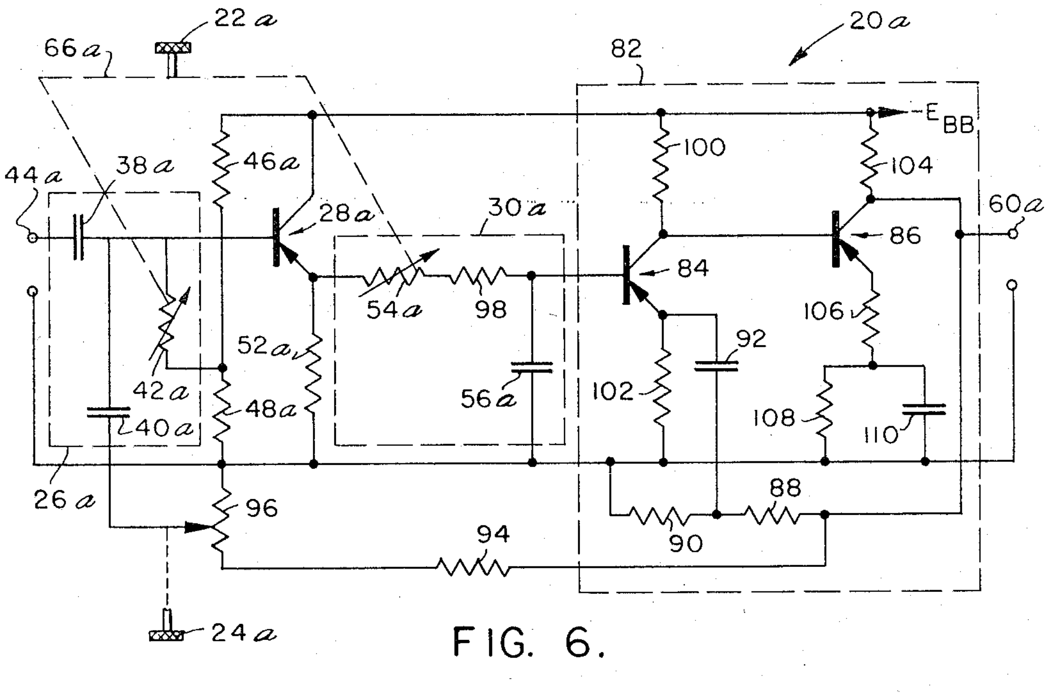
FIG. 6 shows a modification of the circuit shown in FIG. 1.
Figure 7:
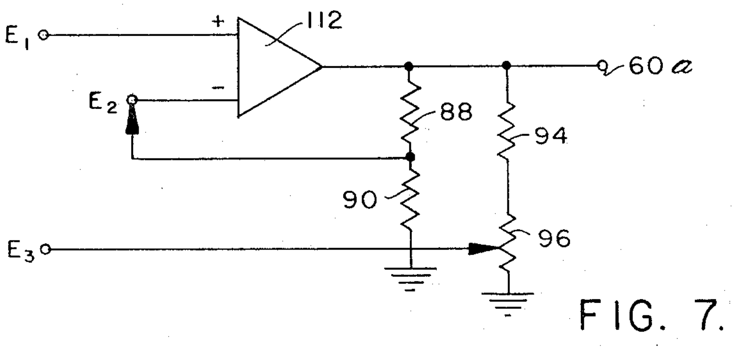
FIG. 7 is a functional block diagram of a portion of the circuit of FIG. 6.

FIG. 6 shows a modification of the circuit arrangement of FIG. 1, in which a two-transistor gain amplifier 82, including transistors 84 and 86, replaces the single output transistor of that circuit. The base of transistor 84 forms the input of stage 82. Both transistors 84 and 86, form individual common emitter gain amplifiers. One pair of serially connected resistors, consisting of resistors 89 and 90 are disposed between the collector of transistor 86 and ground, forming a feedback voltage divider network in which the voltage at the junction of the resistors is coupled to the emitter of transistor 84 through a feedback capacitor 92. The signal is coupled from the emitter to the collector of transistor 84 without inversion, but an inversion takes place between the base and collector of transistor 86. Accordingly, the feedback through this feedback network is in inverse or negative relation to the signal applied to the base of transistor 84. Another pair of serially connected resistors, consisting of resistor 94 and the resistance member of a potentiometer 96, are disposed between the collector of transistor 86 and ground, forming a feedback voltage divider network in which the signal picked off by the movable element of the potentiometer is directly coupled to capacitor **40*a*. The damping factor adjustment knob 24*a* is connected to the movable element of potentiometer 96. The collector of transistor 86 is directly coupled to output terminal 60*a*, forming the output for circuit 20*a*. As a consequence of the fact that double inversion of the signal occurs with the two common emitter gain stages of amplifier 82, the output from buffer transistor 28$a$ is taken from its emitter in order that the feedback signal from transistor 86 to network 26$a$ be in a positive feedback relationship as to the input signal. Circuit 20$a$ also includes fixed resistor 98, collector resistor 100, emitter resistor 102, collector resistor 104, emitter resistors 106, 108 and A.C. bypass capacitor 110. Reference is now made to FIG. 7, which is an equivalent functional diagram of gain amplifier stage 82 and some of its associated components. The cascade connected common emitter transistors 84 and 86 are represented by an equivalent difference amplifier 112 having a gain F, and having one input terminal corresponding to the base of transistor 84, identified by a plus sign (+), and having another input terminal corresponding to the emitter of transistor 84, identified by a minus sign (—). The signal applied to the base of transistor 84 is designated signal $E_1$, the signal fed back from the junction of resistors 88 and 90 to emitter of transistor 84 is designated signal $E_2$, and the signal appearing at the movable element of potentiometer 96 is designated signal $E_3$. By standard equations for closed loop linear feedback circuits, it can be shown that $E_3$ is a well controlled multiplier of $E_1$ for moderate values of gain G, achievable with common emitter transistor configurations, and for values of $E_2$ which are a small proportion of the output of the amplifier, as determined by voltage divider network of resistors 88 and 90. Thus the gain in the feedback loop bridging the output and the input of circuit 20$a$ is fixed and stable, which after the scaling down of the output by the voltage divider of resistor 94, and the resistance member of potentiometer 96, permits the movable contact of potentiometer 96** to pick off the feedback signal at the desired range of loop gains between zero (0) and two (2).

Figure 8:
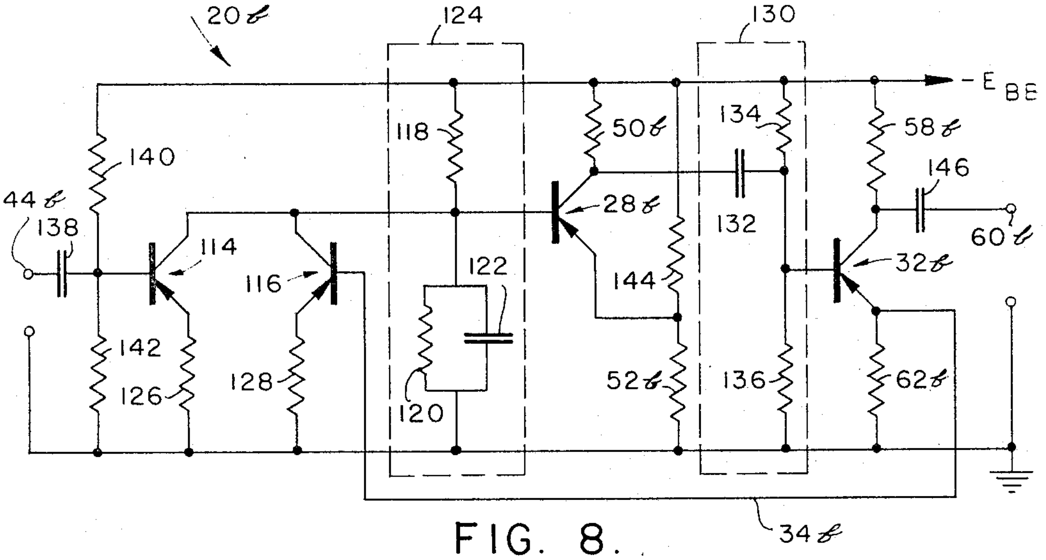
FIG. 8 is schematic of another embodiment of the invention.
Figure 9:
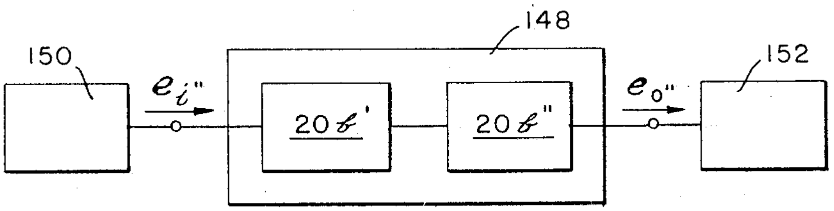
FIG. 9 is a block diagram of a network employing the circuit of FIG. 8.
Figure 10:
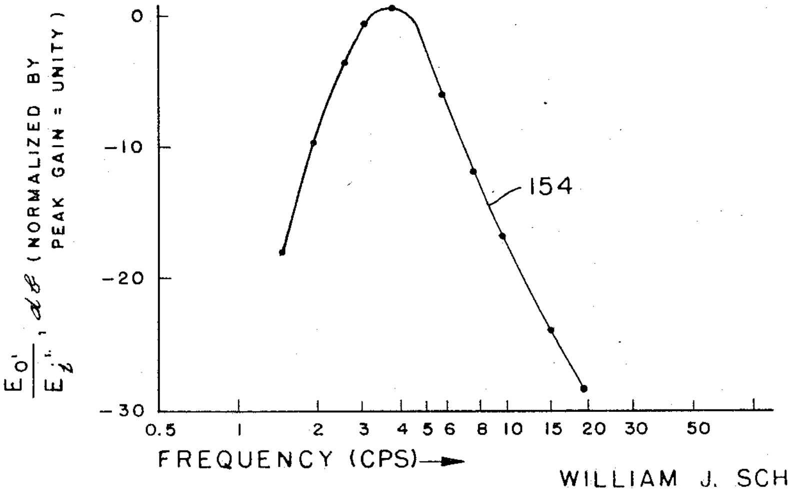
FIG. 10 is a graph illustrating the input-output characteristics of the network of FIG. 9.

FIG. 8 shows another modification for use in providing a narrow pass band in the ultra low range of frequencies near zero frequency, and having particular utility where the levels of signal are very low, such as with weak signals in the range extending down to 100 microvolts. The pass band center frequency and the damping factor of this circuit are fixed instead of adjustable. The input signal and the positive feedback signal are summed by a pair of transistors 114 and 116 having their collectors joined to a common circuit point and coupled to the collector supply voltage through a common collector resistor 118. The common circuit point of the collectors of the summing transistors is also connected to the base of buffer transistor 28$b$ and a resistor 120 and a capacitor 122 are shunt connected between the common circuit point and D.C. ground. Resistors 118 and 120 and capacitor 122 form a low pass network 124 of the type in which a parallel resistance and capacitance are shunt connected across the signal path. It is to be noted that since the collector voltage supply is at A.C. ground, the resistor 118 is effectively shunt connected across the signal path so that its resistance in part forms the resistance determining the high pass characteristics of network 124. The values of the emitter resistors 126 and 128 for transistors 114 and 116 are each of half the value of collector resistor 118, so that the transistors effectively form a unity gain common emitter stage, which exhibits the high transconductance characteristic of an ideal current source. Thus the shunt connected resistance of the high pass network is driven by a current source, providing efficient coupling of the signal. A high pass filter network 130, of the series-capacitance and shunt-resistance form is connected between buffer transistor 28$b$ and output transistor 32$b$. Network 130 consists of a capacitor 132, and resistors 134 and 136. As in the case of resistor 118, resistor 134 is best considered as shunt connected across the A.C. signal path. Feedback across circuit 20$b$ is taken from the emitter of transistor 32$b$ instead of the collector in order to provide feedback in a positive relationship to the input signal. It can be shown that despite reversal of the positions of the high pass and low pass networks and despite low pass filter being of a different form, namely a shunt connected parallel resistance and capacitance form, the voltage transfer function for circuit 20$b$ is the same as that for circuit 20, and therefore circuit 20$b$ provides the desired transfer characteristic. Fixed biases are applied to many of the transistor bases and in one case to an emitter, the resistors in the frequency selective transfer networks serving also as bias voltage divider networks. Circuit 20$b$ also includes an input coupling capacitor 138, voltage divider resistors 140 and 142, an emitter bias network resistor 144, and an output coupling capacitor 146. FIGS. 9 and 10 illustrate a specific use of circuit 20$b$, in which a pair of such circuits 20$b'$ and 20$b''$ are cascaded to form a filter network 148 for providing a narrow band pass centered about a predetermined frequency of several cycles per second. The voltage signal $e_i''$ enters network 148 from a radiometer 150, which has the well known characteristic of providing extremely low output signal levels for inputs just above its threshold of detection. The voltage output signal $e_o''$ leaving network 148 is applied to a utilization circuit 152. The resistance and capacitance product of the pass networks in circuit 20$b'$ and 20$b''$ are chosen to provide circuit pass band center frequencies of 4.5 and 5.5 cycles per second, respectively. FIG. 10 is a plot of the experimentally determined transfer function of network 148. The data from which curve 154 is plotted has been first normalized by the relationship peak, gain=unity.

One important feature of the described circuit is the ease with which a specific design for any desired combination of pass band center frequency and magnitude of damping factor may be synthesized. By comparison of Equation IC and Equations II it will be apparent that values of circuit components which determine center frequency, namely $R_1$, $C_1$, $R_2$ and $C_2$, and the circuit parameters which determine the magnitude of damping factor, namely $A_1$, $A_2$ and $A_3$, form wholly independent steps of circuit parameters. Also from Equations II, it will be seen that the set of parameters $R_1$, $C_1$, $R_2$ and $C_2$ is composed of two conjugate sub-sets $R_1C_1$ and $R_2C_2$, and that the value for the corresponding components needed to provide a desired center frequency may be simply and easily precalculated by the elementary equation, $$RC=\frac{1}{2\pi f_o}$$

Another important feature is that the basis configuration of the frequency selective circuit of the present invention may be readily made of forms of circuit construction which provide a high degree of gain stability. For example, in circuit 20, FIG. 1, the gain stability of stage 28 is enhanced by the fixed bias applied to the base, and the gain stability of stage 32 is enhanced by operation of this stage as a unity gain common emitter amplified. Separate coupling of the output and feedback signals from transistor 32 effectively isolates the feedback path from the circuit load. The omission of bypass capacitors across the emitter resistors of the transistor stages results in stability in the derivation of Equation IA. The presence of the ance of a high degree of gain stability is that it justifies the previously mentioned assumption that the amplifiers of the block diagram in FIG. 2 are nearly ideal voltage sources and thereof can be treated as constant multipliers in the derivative of Equation IA. The presence of the effects of these amplifiers as constants in the derivation of this equation is essential for the circuit to produce the desired transfer characteristics resembling those of naturally resonant circuits. Similarly stability enhancing circuit configurations are employed in circuits 20$b$ and 20$c$.

The following list of components is included as an example of the type and values of circuit components in a specific embodiment of adjustable frequency selective circuit 20, FIG. 1, where the specific embodiment provides a range of pass band center frequencies from 600 to 1000 cycles per second, and range of magnitudes of damping coefficient ξ from zero (0) to two (2).

| | |
|---|---|
| Transistors **28, 32** | 2N417. |
| Capacitors **38, 40** | .022 μf. |
| Var. rest. **42, 54** | 0–1.5 K. |
| Resistor **46** | 11 K. |
| Resistor **48** | 22 K. |
| Resistor **50** | 2K. |
| Resistor **52** | 0.51 K. |
| Capacitor **56** | .047 μf. |
| Pot. **58** | 0.5 K. |
| Resistor **62** | .47 K. |
| Resistor **64** | 5.1 K. |
| $E_{BB}$ | −6 v. |

The following list of components is included as an example of the type and values of circuit components in a sepcific embodiment of adjustable frequency selective amplifier circuit 20*a*, FIG. 6, where the specific embodiment provides a range of pass center frequencies from 600 to 100 cycles per second, and a range of magnitude of damping coefficient ξ from zero (0) to two (2).

| | |
|---|---|
| Trans. **28***a*, **84, 86** | 2N417. |
| Capacitors **38***a*, **40***a* | .022 μf. |
| Var. res. **42***a*, **54***a* | 1.5K. |
| Resistor **46***a*, **52***a* | 5.1K. |
| Resistor **48***a* | 4.7K. |
| Capacitor **56***a* | 0.047 μf. |
| Resistor **88** | 2.7K. |
| Resistor **90** | 33Ω. |
| Capacitor **92** | 20 μf. |
| Resistor **94** | 2.0K. |
| Pot. **96** | 100Ω. |
| Resistor **98** | 1.8K. |
| Resistor **100** | 3.6K. |
| Resistor **102** | 3.0K. |
| Resistor **104** | 820Ω. |
| Resistor **106** | 150Ω. |
| Resistor **108** | 1.8K. |
| Capacitor **110** | 50 μf. |

The following list of components is included as an example of the relative values of circuit components in a specific embodiment of frequency selective circuit 20*c*, FIG. 8, in which relative values of resistances and capacitances are given in terms of ratios relative to a set of resistance and capacitance values which produce a resistance and capacitance needed for the desired pass band center frequency:

| | |
|---|---|
| Resistor **50***b* | 0.5 |
| Resistor **52***b* | 0.27 |
| Resistor **58***b* | 4 |
| Resistors **62***b*, **126, 128, 142** | 1 |
| Resistors **118, 120** | 2 |
| Capacitors **122, 132** | 1 |
| Resistors **134, 144** | 3 |
| Resistor **136** | 0.6 |
| Resistor **140** | 5 |

Obviously many modifications and variations of the present invention are possible in the light of the above teachings. It is therefore to be understood that within the scope of the appended claims the invention may be practiced otherwise than as specifically described.

What is claimed is:

1. A frequency selective circuit for transmission of signals of desired pass band center frequency and attenuation of signals above and below said center frequency with a desired attenuation gradient between the center frequency and the attenuated frequencies, comprising:

(a) matched first and second resistance and capacitance filter networks tandem connected through a buffer means, said first filter network being one of two types consisting of the high pass type and the low pass type, said second filter network being of the other of said two types, (b) positive feedback means bridged across the tandemed networks having a predetermined magnitude of feedback loop gain, (c) the resistance and capacitance high pass type filter network and the resistance and capacitance low pass type network being so matched and said predetermined magnitude of gain being such that the circuit provides the desired pass band center frequency and the desired attenuation gradient, (d) gain amplifier means connected to the output side of said second filter network, said gain amplifier having at least two serially arranged stages, and (e) inverse feedback means bridged across said serially arranged stages to substantially maintain the magnitude of gain of the gain amplifier constant, said positive feedback means bridging the output side of the gain amplifier means and the input side of the first filter network.

2. A frequency selective circuit for transmission of signals of desired pass band center frequency of transmitted signals and for attenuation of frequencies above and below said center frequency with a desired attenuation gradient between the center frequency and the attenuated frequencies, comprising:

(a) a pair of transistors having their collectors connected to a common circuit point, said transistors each being connected in a common emitter amplifier relationship through a single collector resistor connected to said common circuit point, the base of one of the transistors forming the input for receiving an input signal, (b) a low pass network comprising a parallel connected resistance means and capacitance means connected between said common circuit point and signal ground, (c) a buffer amplifier having its input side connected to said common point, (d) an output amplifier, (e) a high pass network comprising a capacitance means connected between the output side of the buffer amplifier and the input side of the output amplifier, and a resistance means connected between the input side of the output amplifier and a signal ground, (f) positive feedback means having a predetermined magnitude of feedback loop gain interconnecting the output side of the output amplifier and the base of the other transistor of the pair, and (g) said high and low pass networks being so matched and said predetermined magnitude of gain being so chosen that the frequencies between the pass band center frequency and the attenuated frequencies above and below center frequency are attenuated with the desired attenuation gradient.

3. A circuit in accordance with claim 2, wherein, (a) the serially and shunt connected impedance means which are simultaneously varied are the resistors.

4. An adjustable frequency selective circuit for transmission of signals of a pass band center frequency which may be selectively varied over a predetermined range of frequencies, and for attenuation of signals above and below said center frequency with an attenuation gradient between the center frequency and the attenuated frequencies, said attenuation gradient being of a selectively variable degree of steepness, said circuit comprising:

(a) first and second resistance and capacitance frequency selective amplitude transfer networks tandem connected through a buffer means, said transfer networks each comprising an impedance means serially connected in the impedance path and an impedance means shunt connected across the signal path, the serially and shunt connected means of one of said transfer networks comprising a resistor and a capacitor, respectively, and the serially and shunt connected means for the other transfer network comprising a capacitor and a resistor, respectively, (b) means for simultaneously varying the magnitude of the serially connected impedance means of one of the transfer networks and varying the magnitude of the shunt connected impedance means of the other transfer network to selectively vary the pass band center frequency between various values in said predetermined range of frequencies and independently of variations in steepness of attenuation gradient, (c) positive feedback means bridged across the tandem connected transfer networks, and (d) said positive feedback means including adjustable means for varying the feedback loop gain to selectively vary the degree of steepness of the attenuation gradient and independently of variation in center frequency.

5. An adjustable frequency selective circuit tunable to transmit signals of a central frequency of transmitted signal which is variable over a predetermined range of frequencies and to attenuate bands of frequencies above and below the center frequency, and adjustable to selectively vary the attenuation gradient between the center frequency and the adjacent limits of the bands of attenuation frequencies, comprising:

(a) a passive summing and high pass network including a pair of summing capacitors connected by one of their respective sides to a summing circuit point and a first variable resistance means connecting said summing point to signal ground, the other side of one of said summing capacitors forming the circuit input for receiving an input signal, (b) a first transistor having a base connected to the summing point, (c) a second transistor having a base, (d) a low pass network coupling the output side of the first transistor and the base of the second transistor, said low pass network comprising a second variable resistance means connected between the output side of the first transistor and the base of the second transistor, and a capacitor connected between the base of the second transistor and signal ground, (e) means for simultaneously varying the magnitude of both the first and second variable resistance means to selectively vary the pass band center frequency between various values in said predetermined range of frequencies and independently of variations in steepness of attenuation gradient, and (f) positive feedback means bridged between the output side of the second transistor and the other side of the other capacitor, said positive feedback means including adjustable means for varying the feedback loop gain to selectively vary the degree of steepness of the attenuation gradient and independently of variations in center frequency.

References Cited by the Examiner

UNITED STATES PATENTS

| | | | |
|---|---|---|---|
| 2,178,072 | 10/1939 | Fritzinger | 330—85 X |
| 2,725,534 | 11/1955 | Hemphill | 330—154 X |
| 2,816,228 | 12/1957 | Johnson. | |
| 2,889,453 | 6/1959 | Stern | 330—21 XR |
| 2,983,875 | 5/1961 | Zechter | 330—21 |
| 3,148,344 | 9/1964 | Kaufman. | |
| 3,212,020 | 10/1965 | Donovan et al. | 330—31 |

References Cited by the Applicant

UNITED STATES PATENTS

| | | |
|---|---|---|
| 2,965,828 | 12/1960 | Wolman. |

ROY LAKE, *Primary Examiner.*

J. B. MULLINS, F. D. PARIS, *Assistant Examiners.*